(12) United States Patent
Jeong (10) Patent No.: US 10,063,091 B2
(45) Date of Patent: Aug. 28, 2018

(54) STANDBY POWER SAVING CIRCUIT

(71) Applicant: DAJAE TECH CO., LTD, Yongin-si, Gyeonggi-do (KR)

(72) Inventor: Yeon Moon Jeong, Yongin-si (KR)

(73) Assignee: DAJAE TECH CO., LTD, Yongin-si, Gyeonggi-Do (KR)

( * ) Notice: Subject to any disclaimer, the term of this patent is extended or adjusted under 35 U.S.C. 154(b) by 166 days.

(21) Appl. No.: 15/116,564

(22) PCT Filed: Jan. 9, 2015

(86) PCT No.: PCT/KR2015/000247
§ 371 (c)(1),
(2) Date: Aug. 4, 2016

(87) PCT Pub. No.: WO2015/119382
PCT Pub. Date: Aug. 13, 2015

(65) Prior Publication Data
US 2016/0359358 A1 Dec. 8, 2016

(30) Foreign Application Priority Data

Feb. 4, 2014 (KR) .......................... 10-2014-0012392

(51) Int. Cl.
*H01J 9/00* (2006.01)
*H02J 9/00* (2006.01)
(Continued)

(52) U.S. Cl.
CPC .............. *H02J 9/005* (2013.01); *H02J 9/061* (2013.01); *H03K 17/785* (2013.01); *H03K 17/79* (2013.01);
(Continued)

(58) Field of Classification Search
CPC ...... H02J 9/005; H02J 9/061; H05B 33/0815; H04N 21/4436; H04N 21/41; H04N 5/63;
(Continued)

(56) References Cited

U.S. PATENT DOCUMENTS

2012/0201062 A1* 8/2012 Lee .................... H02J 9/005
363/84

FOREIGN PATENT DOCUMENTS

KR  10-2002-0050457    6/2002
KR    10-0374819       3/2003
(Continued)

OTHER PUBLICATIONS

International Search Report for International Application No. PCT/KR2015/000247, dated Apr. 3, 2015.

*Primary Examiner* — Richard Tan
(74) *Attorney, Agent, or Firm* — Kile Park Reed & Houtteman PLLC (57) ABSTRACT

Provided is a standby power saving circuit. A switching element is arranged between a SMPS supplying power to a load and a power supply unit supplying power to the SMPS to block power supply to SMPS in a standby mode by turning off the switching element in the standby mode and to supply power to the SMPS only when an electronic device operates. In addition, a circuit supplying a power to a load and a circuit for supplying a standby power are separated, a power storage unit for supplying a driving power to the switching element is arranged inside the circuit for supplying the standby power, and if a charged power of the power storage unit is lower than a reference value, power is supplied to only the circuit for supplying the standby power, and the power storage unit is charged. Therefore it is possible to reduce a standby power.

10 Claims, 3 Drawing Sheets

(51) Int. Cl.
  *H04N 5/63*    (2006.01)
  *H03K 17/79*   (2006.01)
  *H02J 9/06*    (2006.01)
  *H03K 17/785*  (2006.01)
  *H04B 10/50*   (2013.01)
  *H04N 21/41*   (2011.01)
  *H04N 21/443*  (2011.01)
  *H05B 33/08*   (2006.01)

(52) U.S. Cl.
  CPC ............ *H04B 10/502* (2013.01); *H04N 5/63* (2013.01); *H04N 21/41* (2013.01); *H04N 21/4436* (2013.01); *H05B 33/0815* (2013.01); *H03K 2217/0036* (2013.01)

(58) Field of Classification Search
  CPC ................ H03K 17/785; H03K 17/79; H03K 2217/0036; H04B 10/502
  USPC .......................................................... 307/64
  See application file for complete search history.

(56) References Cited

FOREIGN PATENT DOCUMENTS

| | | |
|---|---|---|
| KR | 10-0975642 | 8/2010 |
| KR | 10-2012-0093709 | 8/2012 |

\* cited by examiner

STANDBY POWER SAVING CIRCUIT

TECHNICAL FIELD

The present invention relates to a standby power saving circuit, and more particularly, to a standby power saving circuit installed inside an electronic device such as a television set or a set-top box.

BACKGROUND ART

In general, in information electronic appliances, a switching mode power supply (hereinafter, referred to as an SMPS) having a high efficiency and a small capacity in comparison with a non-switching power supply is widely used as a power supply unit. Even in a standby mode, that is, a state where the electronic appliance does not perform the essential functions, the SMPS is maintained to be in an operation state in order to supply power. Therefore, even in the standby mode, the SMPS consumes a relatively large amount of power.

An existing SMPS controls a gate signal of a MOSFET functioning as a switch by using a PWM signal generator to perform the functions. In the related art for reducing the standby power, an amount of power consumption is reduced by reducing the number of times of switching by using a signal skip method where a PWM signal according to a change in source current of the MOSFET or a feedback signal fed back from a load is not allowed to be generated at a larger period than regulation of an existing pulse width.

However, in the case where the power consumption at the load stage is small, the method of reducing an amount of power consumption by reducing the number of times of switching of the PWM signal, that is, a gate signal of the MOSFET is used. Although the amount of power consumption is reduced in comparison with a normal operation, the switching is maintained at a certain interval, and thus, the SMPS is allowed to continuously operate, so that a certain amount of power is continuously consumed.

In addition, in order to lower the standby power of a large-capacity SMPS or the like, various methods of additionally installing a small-capacity auxiliary SMPS or the like have been attempted. Particularly, in the case where the SMPS is applied to a large-capacity LED illuminating device, there is an increasing need to lower the standby power.

Figure 1:
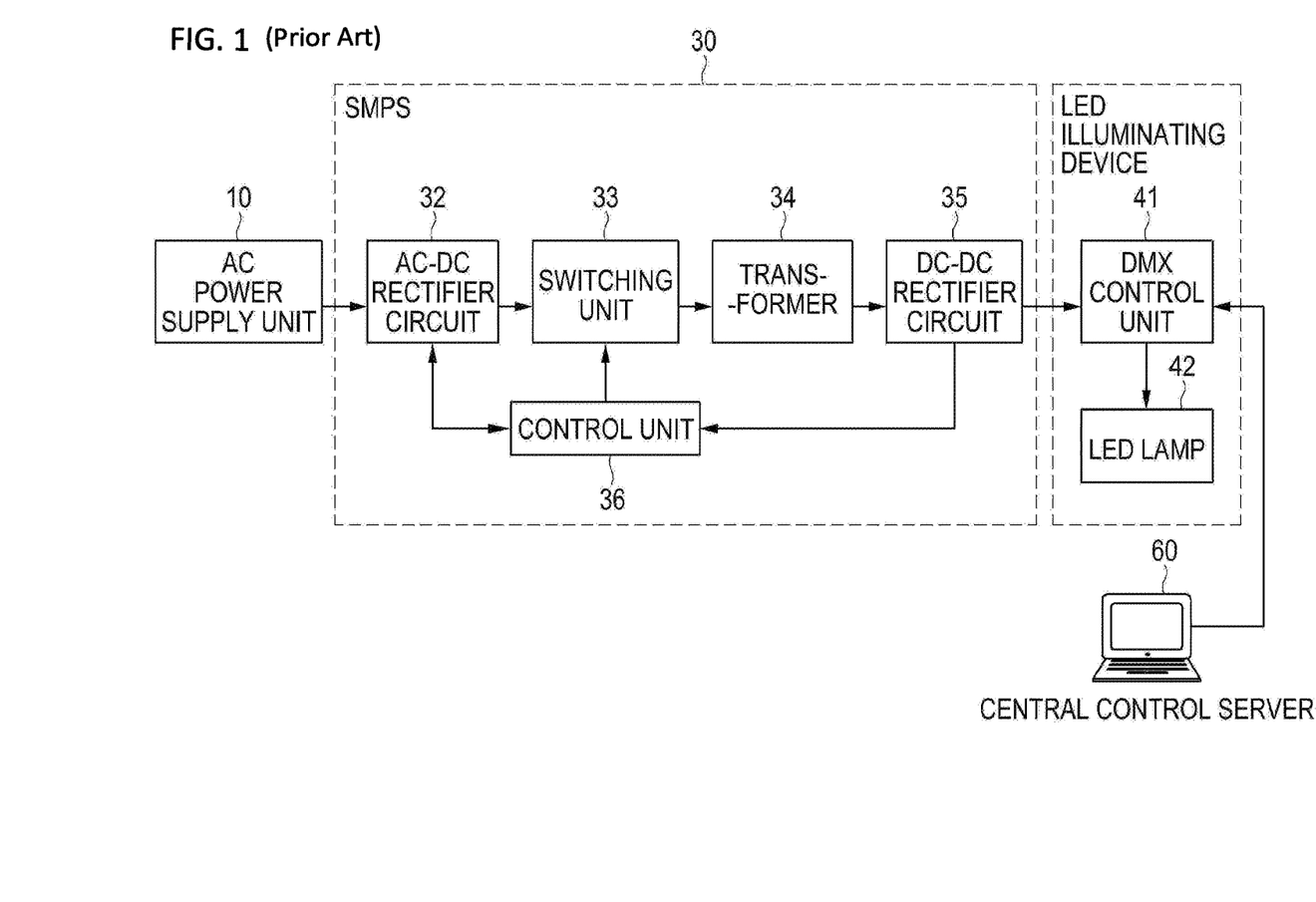
FIG. 1 is a diagram illustrating a configuration of a general SMPS for driving an LED illuminating device as an example of the related art of consuming a standby power.

FIG. 1 is a diagram illustrating a configuration of a general SMPS for driving an LED illuminating device as an example of the related art of consuming a standby power.

Referring to FIG. 1, included are an AC power supply unit 10 which supplies a AC voltage, an SMPS 30 which rectifies and switches the AC voltage supplied from the AC power supply unit 10 and supplies a power, an LED illuminating device 40 which emits light by using the power supplied from the SMPS 30, and a central control server 60 which controls the LED illuminating device 40.

Herein, the SMPS 30 includes an AC-DC rectifier circuit 32, a switching unit 33, a transformer 34, a DC-DC rectifier circuit 35 and a control unit 36, and supplies the output DC power to the LED illuminating device 40.

The AC-DC rectifier circuit 32 removing noise from an AC voltage supplied from the AC power supply unit through filtering, converts the AC voltage to a DC voltage, and outputs the DC voltage to the switching unit 33.

The switching unit 33 performs switching at a frequency of several tens kHz to several MHz by using an element such as a high-withstand-voltage TR, an MOSFET, and an IGBT and outputs the voltage to the transformer 34.

The transformer 34 is determined according to a use frequency and a magnitude of a use power and outputs to the DC-DC rectifier circuit 35.

The DC-DC rectifier circuit 35 converts the DC power which is converted according to a switching control signal input from the control unit 36 to an appropriate power and supplies the appropriate power to the LED illuminating device 40.

At this time, in a standby mode where power supply to the LED illuminating device 40 is unnecessary, an output of an unnecessary portion of the DC-DC rectifier circuit 35 and a secondary coil (not shown) of the transformer 34 is blocked or reduced under the switching control of the control unit 36, so that power supply to the parts to which power supply is unnecessary in the standby mode is blocked or reduced.

However, in this case, in the standby mode, power supply to the SMPS is continuously performed, and thus, power is continuously consumed in the control unit 36 and the DC-DC rectifier circuit 35. Therefore, there is a problem in that a considerable amount of a standby power is consumed.

DISCLOSURE OF THE INVENTION

Problem to be Solved by the Invention

The present invention is to provide a standby power saving circuit capable of reducing a standby power by arranging a switching element between an SMPS supplying power to a load side and a power supply unit supplying power to the SMPS to block power supply to the SMPS in a standby mode.

Means for Solving Problem

According to an aspect of the present invention, there is provided a standby power saving circuit including: a first switching unit which is turned on according to a first switching control signal or a charging control signal to supply a power input from the power supply unit to a voltage regulation unit; the voltage regulation unit which regulates a voltage of the power input from the first switching unit and outputs the voltage; a remote-control-signal receiving unit which receives an input signal from a remote controller and outputs a remote-control signal to a control unit; a power storage unit which is charged with a power supplied from the voltage regulation unit and supplies a driving voltage to a comparison unit, the voltage regulation unit, the control unit and the first switching unit in a standby mode; the comparison unit which compares the power charged in the power storage unit with a reference value and outputs a comparison signal; and the control unit which generates the charging control signal according to the comparison signal and generates the first switching control signal if the remote-control signal is input.

In addition, in the above invention, if the comparison signal represents that the power charged in the power storage unit is lower than the reference value, the control unit may output the charging control signal to the first switching unit to turn on the first switching unit and supply a power supplied from the power supply unit to the voltage regulation unit to charge the power storage unit.

In addition, in the above invention, the standby power saving circuit may further include a rectifier unit which converts an AC power input from the power supply unit to a DC power and outputs the DC power to the first switching unit, wherein the first switching unit includes: a switch which is arranged between the power supply unit and the voltage regulation unit; and a second photo-coupler which turns on the switch by using the power supplied from the rectifier unit if the charging control signal is input.

In addition, in the above invention, the first switching unit may further include: a first switching element of which one end is connected to a cathode of a light-emitting diode included in the second photo-coupler and of which the other end is grounded; and a second switching element which is turned off to turn on the first switching element if the charging control signal is input.

In addition, in the above invention, the first switching element and the second switching element may be PMOS FETs; a source of the first switching element may be connected to the cathode, a drain thereof may be grounded, and a gate thereof may be connected to a drain of the second switching element; a gate of the second switching element may be input with the charging control signal, and a source thereof may be supplied with the driving voltage supplied from the power storage unit; and a resistor of which one end is grounded and of which the other is connected to a gate of the first switching element and a drain of the second switching element may be further included.

In addition, in the above invention, if the remote-control signal is input, the control unit may output the first switching control signal to the first switching unit to turn on the first switching unit and may allow the power supplied from the power supply unit to be supplied to the voltage regulation unit to charge the power storage unit.

In addition, in the above invention, the first switching unit may include: a switch which is arranged between the power supply unit and the voltage regulation unit; and a first photo-coupler which turns on the switch if the first switching control signal is input.

In addition, in the above invention, the first switching unit may further include a switching element of which source is grounded and of which drain is connected to a cathode of a light-emitting diode included in the first photo-coupler and which is turned on if a gate thereof is input with the first switching control signal, and an anode of the light-emitting diode may be supplied with the driving power from the power storage unit, and if the switching element is turned on, a current may be flowed in the light-emitting diode, so that the light-emitting diode emits light.

In addition, in the above invention, the standby power saving circuit may further include: a second switching unit which is turned on to output the power input from the power supply unit to a main SMPS if a second switching signal is input; and the main SMPS which rectifies the power input from the power supply unit and switches to supply the power to a load, wherein the control unit further outputs the second switching signal if the remote-control signal is input.

In addition, in the above invention, the second switching unit may include: a switch which is arranged between the power supply unit and the voltage regulation unit; and a third photo-coupler which turns on the switch if the second switching signal is input.

Effects of the Invention

According to the invention, a switching element is arranged between an SMPS supplying power to a load side and a power supply unit supplying power to the SMPS to block power supply to the SMPS in a standby mode by turning off the switching element in the standby mode and to supply power to the SMPS only when an electronic device operates, so that it is possible to reduce a standby power.

In addition, according to the invention, a circuit supplying a power to a load and a circuit for supplying a standby power are separated, a power storage unit for supplying a driving power to the switching element is arranged inside the circuit for supplying the standby power, and if a charged power of the power storage unit is lower than a reference value, power is supplied to only the circuit for supplying the standby power, and the power storage unit is charged, so that it is possible to minimize consumption of the standby power.

MODE FOR CARRYING OUT THE INVENTION

Hereinafter, exemplary embodiments of the invention will be described with reference to the attached drawings.

Figure 2:
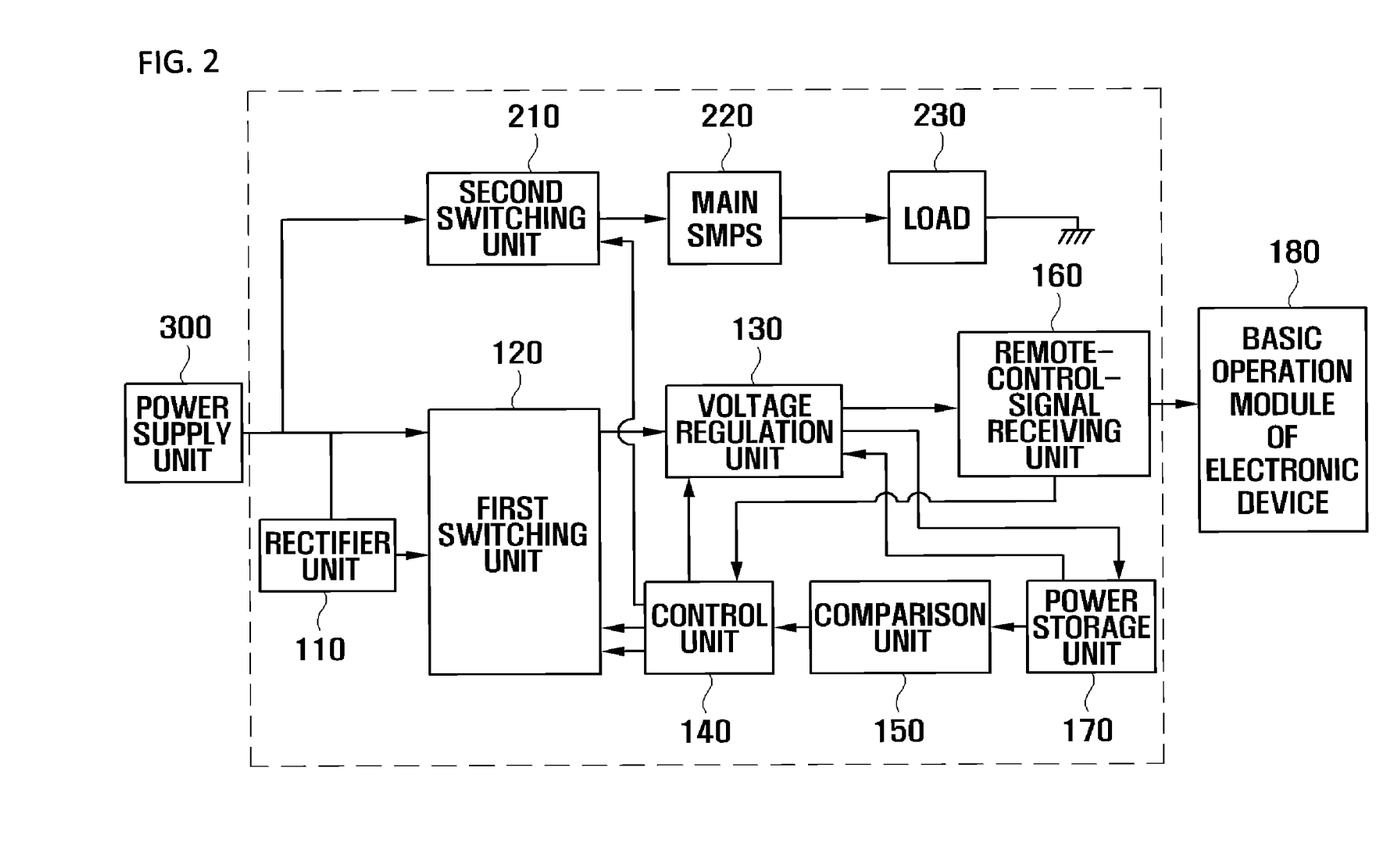
FIG. 2 is a schematic block diagram illustrating an overall configuration of a standby power saving circuit according to an exemplary embodiment of the invention.

FIG. 2 is a schematic block diagram illustrating an overall configuration of a standby power saving circuit according to an exemplary embodiment of the invention.

Referring to FIG. 2, the standby power saving circuit according to the exemplary embodiment of the invention is configured to basically include a power storage unit 170, a comparison unit 150, a control unit 140, a remote-control-signal receiving unit 160, a voltage regulation unit 130, a first switching unit 120, and a rectifier unit 110 and to additionally include a second switching unit 210 and a main SMPS 220.

First, if a first switching control signal and a charging control signal are input from the control unit 140, the first switching unit 120 is switched from an OFF state to an ON state; and if the first switching control signal and the charging control signal are removed, the first switching unit 120 is returned to the OFF state. In the ON state, the first switching unit 120 supplies an AC power input from the power supply unit 300 to the voltage regulation unit 130. In the case where a power-on signal is received from a remote controller (not shown), the first switching control signal is input from the control unit 140; and in the case where a power charged in the power storage unit 170 is decreased down to a reference value or less, the charging control signal is input from the control unit 140. Details thereof will be described later.

The voltage regulation unit 130 converts the power input through the first switching unit 120 from the power supply unit 300 to a DC power, regulates a magnitude of the voltage, and outputs the power to the power storage unit 170 to charge the power storage unit 170. In the case where the first switching unit 120 is in the ON state, the voltage regulation unit 130 is supplied with power from the first switching unit 120 to be driven; and in the case where the first switching unit 120 is in the OFF state, the voltage regulation unit 130 is driven by a driving power VDD supplied from the power storage unit 170. The voltage regulation unit supplies a driving power VDD1 to the remote-control-signal receiving unit 160 intermittently or continuously as needed, so that the remote-control-signal receiving unit 160 is allowed to be driven with a low power.

The remote-control-signal receiving unit 160 receives a remote controller input signal configured with an infrared signal or an RF signal from a corresponding remote controller and outputs the remote controller input signal to a basic operation module 180 of an electronic device (for example, a television set, a set-top box, or the like) provided with the control unit 140 and the standby power saving circuit. Particularly, the remote-control-signal receiving unit 160 outputs a signal associated with power-on/off among input signals received from the remote controller to the control unit 140.

The power storage unit 170 is charged with power supplied from the voltage regulation unit 130. During the operation standby, the power storage unit 170 supplies driving voltages to the comparison unit 150, the voltage regulation unit 130, the control unit 140, and the first switching unit 120. The power storage unit 170 according to the exemplary embodiment of the invention stores +5 V power.

The comparison unit 150 compares the power charged in the power storage unit 170 and a reference value and outputs to the control unit 140 a comparison signal indicating whether the voltage value of the power charged in the power storage unit 170 is higher than the reference value or equal to or lower than the reference value.

The control unit 140 generates the charging control signal according to the comparison signal. If the remote-control signal is input, the control unit 140 generates the first switching control signal. Namely, if the remote-control signal is input, the control unit 140 generates the first switching control signal and outputs the first switching control signal to the first switching unit 120 in order to allow the first switching unit 170 to perform charging. Although the remote-control signal is not input, if it is determined based on the comparison signal that the voltage of the power storage unit 170 is lower than the reference value, the control unit outputs the charging control signal to the first switching unit 120 to switch the first switching unit 120 to the ON state in order to allow the power storage unit 170 to perform charging.

More specifically, in the case where the comparison signal input from the comparison unit 150 indicates that the power charged in the power storage unit 170 is equal to or lower than a reference value, in order to allow the power storage unit 170 to perform charging, the control unit 140 generates the charging control signal and outputs the charging control signal to the first switching unit 120 to turn the first switching unit 120 to the ON state, so that the power storage unit 170 is charged. In addition, in the case where the comparison signal input from the comparison unit 150 indicates that the power charged in the power storage unit 170 is lower than the reference value, the control unit 140 outputs a voltage comparison signal to the voltage regulation unit 130 and allows the voltage regulation unit 130 to output a control signal for allowing the remote-control-signal receiving unit 160 to be in a sleep mode. If the power charged is equal or higher than the reference value, the control unit 140 output the voltage comparison signal to the voltage regulation unit 130 and allows the voltage regulation unit 130 to output a control signal for allowing the remote-control-signal receiving unit 160 to be released from the sleep mode.

On the other hand, if the remote-control signal is input, the control unit 140 generates a second switching control signal to turn on the second switching unit 210 so that a load 230 is supplied with power. At the same time, the control unit outputs the first switching control signal to turn on the first switching unit 120 so that the charging of the power storage unit 170 can be performed, and thus, the AC power input from the power supply unit 300 is charged into the power storage unit 170 through the voltage regulation unit 130.

On the other hand, the second switching unit 210 is arranged between the power supply unit 300 and the main SMPS 220. In a normal period, the second switching unit 210 is maintained to be in the OFF state. If the second switching control signal generated by the control unit 140 which has received the remote-control signal is received, the second switching unit 210 is switched to the ON state to output to the main SMPS 220 the AC power input from the power supply unit 300. In the OFF state where the electronic device does not operate, the second switching unit 210 is also supplied with the driving power VDD from the power storage unit 170.

The main SMPS 220 rectifies and switches the power input from the power supply unit 300 to supply the rectified power to the load 230. Since the functions of the main SMPS 220 are the same as the function of the SMPS of a general electronic device, the detailed description thereof is omitted.

The load 230 is a component of consuming power in various electronic devices. In the case where the standby power saving circuit according to the invention is implemented in a television set, all parts of performing functions unique to the television set correspond to the load 230. Besides, all parts of performing essential functions of an electronic device in which the standby power saving circuit according to the invention is implemented correspond to the load 230.

Functions of the standby power saving circuit according to the exemplary embodiment of the invention will be described with reference to FIG. 2. First, when a user issues a remote controller input signal of instructing power-on by using a remote controller, the remote controller input signal is received by the remote-control-signal receiving unit 160, and the remote-control-signal receiving unit 160 outputs a remote-control signal to the control unit 140.

When receiving the remote-control signal, the control unit 140 generates a second switching control signal and outputs the second switching control signal to the second switching unit 210 in order to power on the electronic device to operate and generates a first switching control signal and outputs the first switching control signal to the first switching unit 120 in order to charge the power storage unit 170 in the state that the electronic device is powered on.

When receiving the second switching control signal from the control unit 140, the second switching unit 210 is switched from the OFF state to the ON state to transfer the AC power input from the power supply unit 300 to the main SMPS 220 to supply power to the load 230.

In addition, when receiving the first switching control signal, the first switching unit 120 is switched from the OFF state to the ON state to transfer the AC power input from the power supply unit 300 to the voltage regulation unit 130, and the voltage regulation unit 130 regulates the power input from the power supply unit 300 to charge the power storage unit 170.

On the other hand, in the case where the user issues a power-off input signal by using the remote controller in order to end the using of the electronic device, the remote-control-signal receiving unit 160 receives the power-off input signal and transmits the power-off input signal to the basic operation module 180. In addition, the remote-controlsignal receiving unit 160 outputs a remote-control signal representing power-off to the control unit 140, and the control unit 140 stops the outputting of the first and second switching control signals.

Therefore, the first switching unit 120 and the second switching unit 210 are switched from the ON state to the OFF state, so that the power supplied from the power supply unit 300 to the main SMPS 220 and the voltage regulation unit 130 is blocked, and the electronic device enters into the standby mode to be maintained in the standby mode.

On the other hand, in the standby mode, the power storage unit 170 continuously supplies the driving power VDD so that the voltage regulation unit 130, the first switching unit 120, the second switching unit 210, the control unit 140, the comparison unit 150, and the remote-control-signal receiving unit 160 can be driven in the standby mode. The comparison unit 150 compares the power charged in the power storage unit 170 with the reference value. If the voltage value of the charged power is lowered down to the reference value or less, the comparison unit 150 outputs to the control unit 140 a comparison signal representing that the charged voltage is lowered down to the reference value or less. In the exemplary embodiment of the invention, the comparison signal is designed so that, in the case where the voltage value of the charged power is higher than 2.7 V as the reference value, a signal of logic value Low is output and, in the case where the voltage value of the charged power is equal to or lower than 2.7 V as the reference value, a signal of logic value High is output (namely, if the voltage of the charged power is equal to or lower than 2.7 V as the reference value, a comparison signal is output, and if the voltage of the charged power is higher than 2.7 V as the reference value, the comparison signal is not output).

When receiving the comparison signal of logic value High, the control unit 140 outputs the charging control signal to the first switching unit 120.

If the first switching unit 120 is supplied with a smoothened power from the rectifier unit 110 and receives the charging control signal from the control unit 140 in the standby mode, the first switching unit 120 is switched from the OFF state to the ON state to output the power input from the power supply unit 300 to the voltage regulation unit 130 to charge the power storage unit 170.

Figure 3:
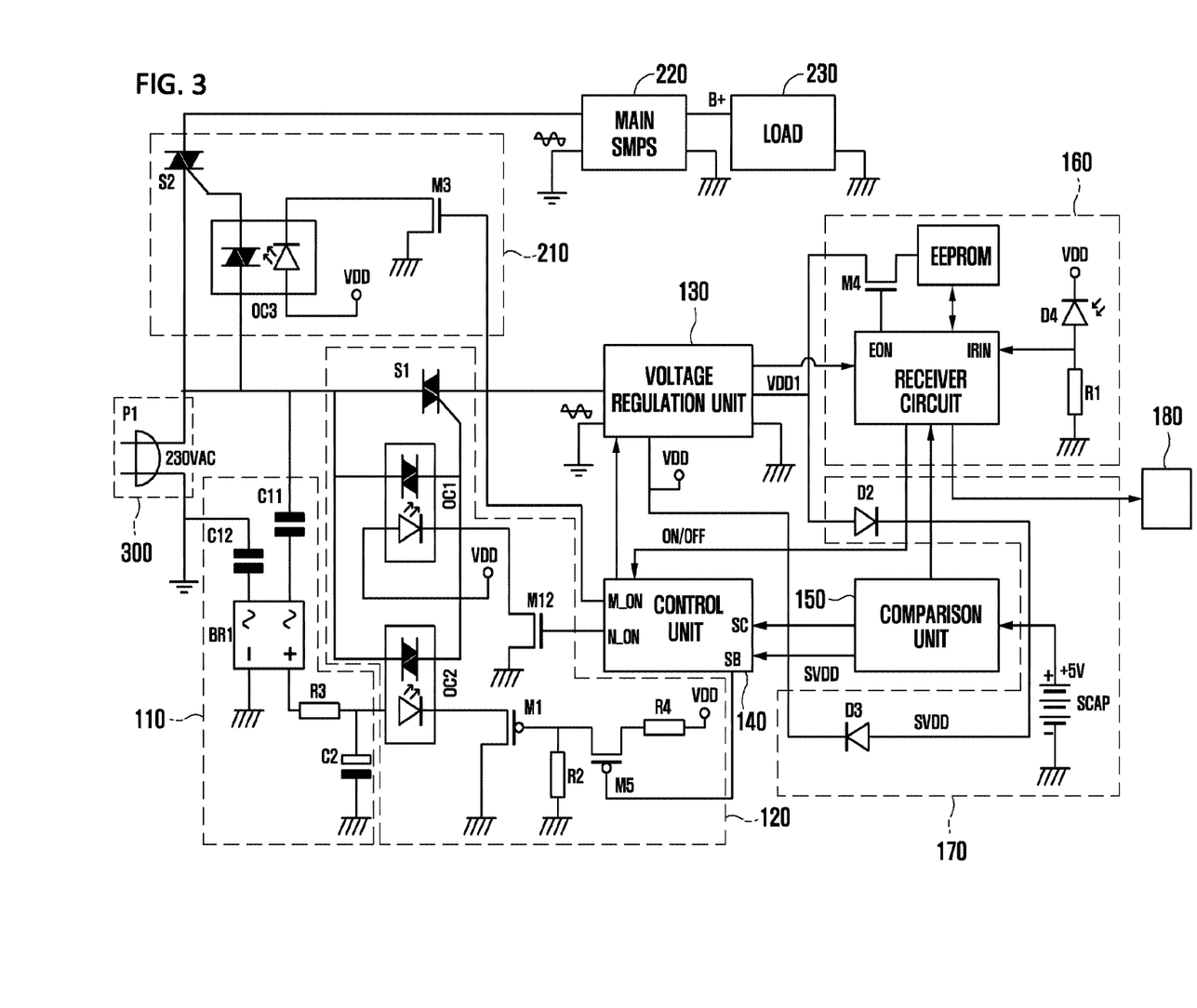
FIG. 3 is a diagram illustrating a detailed configuration of the standby power saving circuit according to the exemplary embodiment of the invention.

FIG. 3 is a diagram illustrating a detailed configuration of the standby power saving circuit according to the exemplary embodiment of the invention.

The circuit configuration of the standby power saving circuit will be described more in detail with reference to FIG. 3. The power storage unit 170 is configured with a secondary battery, a double-layered condenser, or the like so as to charge 5 V power.

The rectifier unit 110 is configured to include three capacitors C11, C12, and C2, a bridge rectifier circuit BR1, and a resistor R3. The rectifier unit 110 supplies a rectified power to an anode of a light-emitting diode included in a second photo-coupler OC2 included in the first switching unit 120.

The first switching unit 120 is configured to include a first triac switch S1 which is provided between the power supply unit 300 and the voltage regulation unit 130 to be switched on or off, first and second photo-couplers OC1 and OC2 which are connected to a gate of the first triac switch S1 to switch on or off the first triac switch S1, an FET switch M2 which allow the first photo-coupler OC1 to operate, two PMOS switches M1 and M5 which allow the second photo-coupler OC2 to operate, and and two resistors R2 and R4.

As illustrated in FIG. 3, an anode of the a light-emitting diode included in the first photo-coupler OC1 is supplied with the power from the power storage unit 170, a cathode thereof is connected to a drain of the FET switch M2, and the first switching control signal output from a terminal N_ON of the control unit 140 is input to a gate of the FET switch M2, so that the FET switch M2 is turned on. When the FET switch M2 is turned on, a current is flowed to the light-emitting diode included in the first photo-coupler OC1, and the first photo-coupler OC1 is allowed to operate to turn on the first triac switch S1, so that the power supply unit 300 and the voltage regulation unit 130 are connected to each other, and thus, the power is supplied to the voltage regulation unit 130.

In addition, the anode of the light-emitting diode included in the second photo-coupler OC2 is supplied with the smoothened power from the rectifier unit 110, and the cathode thereof is connected to a source of the PMOS switch M1.

A gate of the PMOS switch M1 is connected to a drain of the PMOS switch M5, and a source of the PMOS switch M5 is supplied with the driving power VDD through the resistor R4. A connection node of the gate of the PMOS switch M1 and a drain of the PMOS switch M5 is commonly connected to the resistor R2, and the gate of the PMOS switch M5 is connected to a terminal SB of the control unit 140.

The terminal SB of the control unit 140 outputs the charging control signal. In the case where the charging control signal is not output from the terminal SB, the gate of the PMOS switch M5 is applied with a LOW value, and the PMOS switch M5 is maintained to be in the ON state, and a current is flowed between the source and drain of the PMOS switch M5. Due to this current, a voltage is generated across the resistor R2. The voltage is applied as a High voltage value to the gate of the PMOS switch M1, so that the PMOS switch M1 is maintained to be in the OFF state. Therefore, since no current is flowed in the light-emitting diode of the second photo-coupler OC2, the second photo-coupler OC2 does not operate, and thus, the first triac switch S1 is maintained to be in the OFF state.

On the other hand, if the voltage of the power storage unit 170 is lowered and, thus, the charging control signal is output from the terminal SB of the control unit 140, the gate of the PMOS switch M5 is applied with a High signal, so that the PMOS switch M5 is turned off. Therefore, the voltage of the gate of the PMOS switch M1 is removed, so that the gate of the PMOS switch M1 is applied with a Low voltage. Therefore, the PMOS switch M1 is turned on, so that a current is flowed in the light-emitting diode of the second photo-coupler OC2, so that the second photo-coupler OC2 operates. Therefore, the gate of the first triac switch S1 is applied with a voltage, so that the first triac switch S1 is switched from the OFF state to the ON state. Therefore, the power supply unit 300 supplies a power to the voltage regulation unit 130, so the power storage unit 170 is charged.

The second switching unit 210 is configured to include a second triac switch S2 which is provided between the power supply unit 300 and the main SMPS 220, a third photo-coupler OC3 which includes a light-emitting diode of which anode is supplied with the driving power VDD from the power storage unit 170 and of which cathode is connected to a drain of an FET switch M3 and is controlled by the FET switch M3 to operate the second triac switch S2, and the FET switch M3 which is turned on or off according to the second switching control signal input from the control unit 140 to operate the third photo-coupler OC3.

The remote-control-signal receiving unit 160 is configured to include a light-receiving element D4, a receiver circuit, a storage unit configured with an EEPROM, and an FET switch M4. When the remote controller generates an infrared signal or an RF signal, the light-receiving element D4 receives the signal and outputs the signal to the receiver circuit.

When receiving the remote-controller input signal from the light-receiving element D4 through a terminal IRIN, the receiver circuit applies a power to the gate of the FET switch M4 to supply the power to the EEPROM and interprets the remote controller input signal by using a code stored in the EEPROM to output a remote-control signal representing on/off of the standby mode to the control unit 140.

Functions of the standby power saving circuit according to the exemplary embodiment of the invention will be described with reference to FIG. 3. First, when the user issues the remote controller input signal instructing power-on by using the remote controller, the remote controller input signal is received by the light-receiving element D4 of the remote-control-signal receiving unit 160, and the signal is input to a terminal IRIN of the receiver circuit (RF/IR receiver). The receiver circuit outputs the signal to a terminal EON to turn on the FET switch M4, so that a power is supplied to the EEPROM. The receiver circuit interprets by using a code stored in the EEPROM whether the received remote controller input signal is a power-on signal or a power-off signal and outputs the remote-control signal representing the power-on or the power-off to the control unit 140.

In the case where the remote-control signal is the signal instructing power-on of the electronic device, the control unit 140 outputs the second switching control signal through the terminal M_ON to the FET switch M3 of the second switching unit 210 in order to power on the electronic device to operate the electronic device, and the control unit 140 output the first switching control signal through the terminal N_ON to the FET switch M2 of the first switching unit 120 in order to charge the power storage unit 170 in the state that the electronic device is powered on.

The FET switch M3 of the second switching unit 210 which has received the second switching control signal is turned on. Therefore, the third photo-coupler OC3 operates, and thus, the second triac switch S2 is switched on, so that the AC power is supplied from the power supply unit 300 to the main SMPS 220. The main SMPS 220 converts the AC power to a DC power and supplies the DC power to the load 230, so that the electronic device is allowed to perform the essential functions thereof.

On the other hand, the FET switch M2 of the first switching unit 120 which has received the first switching control signal is turned on, and thus, the light-emitting diode of the first photo-coupler OC1 is turned on, so that the first photo-coupler OC1 operates. The first photo-coupler OC1 turns on the first triac switch S1. When the first triac switch S1 is turned on, a power is supplied from the power supply unit 300 to the voltage regulation unit 130. The voltage regulation unit 130 regulates the power supplied from the power supply unit 300 and outputs the power through the diode D2 to the power storage unit 170, so that the power storage unit 170 is charged.

On the other hand, in the state that the electronic device is powered off, as described above, the power charged in the power storage unit 170 is supplied as the driving power of the remote-control-signal receiving unit 160, the voltage regulation unit 130, the control unit 140, the comparison unit 150, the first switching unit 120, and the second switching unit 210 driving power. Therefore, as time elapses, the power of the power storage unit 170 is decreased. The comparison unit 150 compares the voltage charged in the power storage unit 170 with a reference value (for example, 2.7 V). If the voltage of the charged power is equal to or lower than the reference value, the comparison unit 150 outputs to the terminal SC of the control unit 140 a comparison signal representing that the voltage value of the charged power is equal to or lower than the reference value. The control unit 140 checks the comparison signal input from the terminal SC, and if it is determined that the voltage value of the charged power is equal to or lower than the reference value, the control unit 140 output the charging control signal (High signal) through the terminal SB to the gate of the PMOS switch M5 of the first switching unit 120 so that the charging of the power storage unit 170 is performed.

Before the charging control signal is input to the first switching unit 120, since a Low signal is input to the gate of the PMOS switch M5 of the first switching unit 120, the PMOS switch is always maintained to be in the ON state. Therefore, the driving voltage VDD is distributed to the resistor R4 and the resistor R2, and due to the voltage of the resistor R2, a High signal is applied to the M1 of the PMOS switch M1. Since the PMOS switch M1 is maintained to be in the turned OFF state, the second photo-coupler OC2 do not operates, and thus, the first triac switch S1 is maintained in the OFF state.

However, when the charging control signal (High signal) from the control unit 140 is input to the gate of the PMOS switch M5 of the first switching unit 120, the PMOS switch M5 is tuned off, a voltage is not applied to the resistor R2. Therefore, a Low signal is applied to the gate of the PMOS switch M1, and thus, the PMOS switch M1 is turned on, so that a current is flowed in the light-emitting diode included in the second photo-coupler OC2. Therefore, the second photo-coupler OC2 operates, and thus, a High signal is applied to the gate of the first triac switch S1, so that the first triac switch S1 is turned on. When the first triac switch S1 is turned on, a power is input from the power supply unit 300 to the voltage regulation unit 130. The voltage regulation unit 130 supplies a charging current through the diode D2 to the power storage unit 170 to charge the power storage unit 170.

Heretofore, the exemplary embodiments of the invention are described. It can be understood by the skilled in the art that the invention can be embodied in modified forms within the scope not departing from the spirit of the invention. Therefore, the embodiments disclosed should be considered in a descriptive point of view rather than a restrictive point of view. The scope of the invention is defined by not the detailed description but the claims, and all differences within the equivalent scope should be construed to be included within the scope of the invention.

The invention claimed is:
1. A standby power saving circuit comprising:
a first switching unit which is turned on according to a first switching control signal or a charging control signal to supply a power input from a power supply unit to a voltage regulation unit;
the voltage regulation unit which regulates a voltage of the power input from the first switching unit and outputs a regulated voltage;
a remote-control-signal receiving unit which receives an input signal from a remote controller and outputs a remote-control signal to a control unit;

a power storage unit which is charged with a power supplied from the voltage regulation unit and supplies a driving voltage to a comparison unit, the voltage regulation unit, the control unit and the first switching unit in a standby mode;

the comparison unit which compares the power charged in the power storage unit with a reference value and outputs a comparison signal; and the control unit which generates the charging control signal according to the comparison signal and generates the first switching control signal if the remote-control signal is input.

2. The standby power saving circuit according to claim 1, wherein if the comparison signal represents that the power charged in the power storage unit is lower than the reference value, the control unit outputs the charging control signal to the first switching unit to turn on the first switching unit and supplies a power supplied from the power supply unit to the voltage regulation unit to charge the power storage unit.

3. The standby power saving circuit according to claim 2, further comprising a rectifier unit which converts an AC power input from the power supply unit to a DC power and outputs the DC power to the first switching unit, wherein the first switching unit includes:
a switch which is arranged between the power supply unit and the voltage regulation unit; and
a second photo-coupler which turns on the switch by using the power supplied from the rectifier unit if the charging control signal is input into the first switching unit.

4. The standby power saving circuit according to claim 3, wherein the first switching unit further includes:
a first switching element of which one end is connected to a cathode of a light-emitting diode included in the second photo-coupler and of which the other end is grounded; and
a second switching element which is turned off to turn on the first switching element if the charging control signal is input into the first switching unit.

5. The standby power saving circuit according to claim 4, wherein the first switching element and the second switching element are PMOS FETs, wherein a source of the first switching element is connected to the cathode of the light-emitting diode, a drain thereof is grounded, and a gate thereof is connected to a drain of the second switching element, wherein a gate of the second switching element is input with the charging control signal, and a source thereof is supplied with the driving voltage supplied from the power storage unit, and wherein a resistor of which one end is grounded and of which the other end is connected to a gate of the first switching element and a drain of the second switching element is further included.

6. The standby power saving circuit according to claim 1, wherein if the remote-control signal is input, the control unit outputs the first switching control signal to the first switching unit to turn on the first switching unit and allows the power supplied from the power supply unit to be supplied to the voltage regulation unit to charge the power storage unit.

7. The standby power saving circuit according to claim 6, wherein the first switching unit includes:
a switch which is arranged between the power supply unit and the voltage regulation unit; and
a first photo-coupler which turns on the switch if the first switching control signal is input.

8. The standby power saving circuit according to claim 7, wherein the first switching unit further includes a switching element of which source is grounded and of which drain is connected to a cathode of a light-emitting diode included in the first photo-coupler and which is turned on if a gate thereof is input with the first switching control signal, and wherein an anode of the light-emitting diode is supplied with a driving power from the power storage unit, and if the switching element is turned on, a current is flowed in the light-emitting diode, so that the light-emitting diode emits light.

9. The standby power saving circuit according to claim 1, further comprising:
a second switching unit which is turned on to output the power input from the power supply unit to a main SMPS if a second switching signal is input into the second switching unit; and
the main SMPS which rectifies the power input from the power supply unit and switches to supply a power to a load, wherein the control unit further outputs the second switching signal if the remote-control signal is input into the control unit.

10. The standby power saving circuit according to claim 9, wherein the second switching unit includes:
a switch which is arranged between the power supply unit and the voltage regulation unit; and
a third photo-coupler which turns on the switch if the second switching signal is input into the second switching unit.

* * * * *